United States Patent
Fukushima et al.

(10) Patent No.: US 10,871,515 B2
(45) Date of Patent: Dec. 22, 2020

(54) METHOD OF MEASURING FE CONCENTRATION IN P-TYPE SILICON WAFER

(71) Applicant: SUMCO CORPORATION, Tokyo (JP)

(72) Inventors: Shinya Fukushima, Tokyo (JP); Masahiko Mizuta, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 204 days.

(21) Appl. No.: 15/765,792

(22) PCT Filed: Sep. 5, 2016

(86) PCT No.: PCT/JP2016/004049
§ 371 (c)(1),
(2) Date: Apr. 4, 2018

(87) PCT Pub. No.: WO2017/061072
PCT Pub. Date: Apr. 13, 2017

(65) Prior Publication Data
US 2018/0284182 A1 Oct. 4, 2018

(30) Foreign Application Priority Data
Oct. 7, 2015 (JP) .................... 2015-199589

(51) Int. Cl.
*G01R 31/26* (2020.01)
*G01R 31/265* (2006.01)
*H01L 21/66* (2006.01)

(52) U.S. Cl.
CPC ..... *G01R 31/2648* (2013.01); *G01R 31/2656* (2013.01); *H01L 22/14* (2013.01); *H01L 22/12* (2013.01)

(58) Field of Classification Search
CPC ........... G01R 31/2648; G01R 31/2656; G01R 31/2831; H01L 22/10; H01L 22/12; H01L 22/14; G01N 21/9501; G01N 21/9505
See application file for complete search history.

(56) References Cited

U.S. PATENT DOCUMENTS

| | | | |
|---|---|---|---|
| 5,742,176 A * | 4/1998 | Kato | G01R 31/2648 257/E21.53 |
| 2004/0010394 A1* | 1/2004 | Koveshnikov | G01R 31/2831 702/183 |

(Continued)

FOREIGN PATENT DOCUMENTS

| | | |
|---|---|---|
| JP | 2004-503100 | 1/2004 |
| JP | 2005-277417 | 10/2005 |
| JP | 2007-53123 | 3/2007 |

OTHER PUBLICATIONS

International Search Report issued in PCT/JP2016/004049, dated Nov. 22, 2016.

(Continued)

*Primary Examiner* — Son T Le
*Assistant Examiner* — Dustin R Dickinson
(74) *Attorney, Agent, or Firm* — Greenblum & Bernstein, P.L.C.

(57) ABSTRACT

Provided is a method of measuring the Fe concentration in a p-type silicon wafer by the SPV method, by which the detection limit for the Fe concentration can be lowered, and the measurement can be performed in a short time. The measurement by the SPV method is performed in a measurement mode in which irradiation with a plurality of lights having mutually different wavelengths is performed during the same period under conditions where (i) Time Between Readings is 35 ms or more and 120 ms or less and Time Constant is 20 ms or more, or Time Between Readings is 10

(Continued)

ms or more and less than 35 ms and Time Constant is 100 ms or more, and (ii) Number of Readings is 12 times or less.

1 Claim, 2 Drawing Sheets

(56) References Cited

U.S. PATENT DOCUMENTS

2005/0206402 A1     9/2005   Shi et al.
2010/0085073 A1*    4/2010   Lagowski .......... G01R 31/2648
                                                            324/754.21
2012/0049329 A1     3/2012   Ohno et al.

OTHER PUBLICATIONS

Office Action issued in Taiwan Counterpart Patent Appl. No. 105131554, dated Feb. 22, 2017, along with an english translation thereof.
International Preliminary Report on Patentability and English translation thereof in PCT/JP2016/004049, dated Apr. 10, 2018.
Foreign Office Action issued in German patent application No. 11 2016 004 6332, dated Jul. 10, 2020 and English language translation thereof.

* cited by examiner

METHOD OF MEASURING FE CONCENTRATION IN P-TYPE SILICON WAFER

TECHNICAL FIELD

This disclosure relates to a method of measuring the Fe concentration in a p-type silicon wafer using a surface photovoltage (SPV) method.

BACKGROUND

Contamination of a p-type silicon wafer by Fe affects the characteristics of a device fabricated from the wafer. With this being the case, techniques for evaluating the Fe concentration in p-type silicon wafers in a simplified manner have been developed. One of the techniques known is a method of electrically measuring the diffusion length of minority carriers in a p-type silicon wafer by the SPV method and calculating the Fe concentration in the wafer from the measurement result.

In the SPV method, a p-type silicon wafer is irradiated with lights having certain wavelengths, and the surface photovoltage (SPV signal) of the wafer at that time is measured, thereby determining the diffusion length of minority carriers in the wafer. This procedure is hereinafter also simply referred to as "SPV measurement". The SPV method is an excellent method that enables a shorter measurement time compared with other methods and allows for non-contact and non-destructive measurements.

SPV measurement is known to have two measurement modes: Standard Mode and Ultimate Mode. In the SPV method, a plurality of lights having mutually different wavelengths are necessarily used to perform the SPV measurement. Standard Mode is a typical method of performing an SPV measurement using a certain wavelength and sequentially performing other SPV measurements using wavelengths that are different from the preceding wavelength and from each other. Ultimate Mode is a special method of performing SPV measurement by irradiation with a plurality of lights having mutually different wavelengths at a time during the same period.

JP 2004-503100 A (PTL 1) describes that when a measurement is performed using Ultimate Mode, the measurement can be completed in a shorter time compared with the case of Standard Mode, which can reduce measurement error for the diffusion length of minority carriers due to environmental variations over time in the measurement. Smaller measurement error for the diffusion length of minority carriers means that the detection limit for the Fe concentration can be made lower.

CITATION LIST

Patent Literature

PTL 1: JP 2004-503100 A

SUMMARY

Technical Problem

In recent years, characteristics required of devices are significantly higher. In this situation, there is an increased need for the detection limit for the Fe concentration in a p-type silicon wafer to be lowered. On the other hand, the time required for SPV measurement have an influence on the production throughput in the production of a p-type silicon wafer, so the time is required to be as short as possible. The inventors have recognized the new challenges for addressing those two needs at the same time and made various studies.

In the studies, they contemplated use of Ultimate Mode based on the description of PTL 1. It is certain that the time required for measurement can more easily be shorted using Ultimate Mode than using Standard Mode due to the difference in the measurement approaches. However, according to the studies made by the inventors, although the measurement time was shortened by changing the measurement mode from Standard Mode to Ultimate Mode as a matter of course, the detection limit for the Fe concentration was not lowered contrary to the description of PTL 1, and the detection limit for the Fe concentration was found to have been rather higher.

In view of the above problem, it could be helpful to provide a method of measuring the Fe concentration in a p-type silicon wafer by the SPV method, by which the detection limit of a measurement for the Fe concentration can be lowered and the measurement can be performed in a short time.

Solution to Problem

SPV measurement has various measurement parameters other than the measurement modes as described below in detail. With a view to solving the above problem, the inventor investigated the influence of the parameter settings set on an SPV measurement apparatus other than the measurement modes, on the detection limit for the Fe concentration and the time required for the measurement of the Fe concentration. Note that PTL 1 only describes that the error for the diffusion length of minority carriers is reduced when the measurement is performed using Ultimate Mode, whereas optimizing the other setting parameters is not considered in PTL 1.

Given this situation, the inventors first variously changed the measurement parameters in Standard Mode recommended by the manufacturer of the SPV apparatus on the basis of known values also recommended by the manufacturer. Thereupon, they found that a parameter Number of Readings to be described had a great influence on the detection limit for the Fe concentration in Standard Mode. Specifically, increasing Number of Readings can lower the detection limit for the Fe concentration. However, higher Number of Readings means a longer time required for measurement. Thus, in Standard Mode, the detection limit for the Fe concentration can be made low with any measurement parameters being set under the conditions where the measurement time is long, whereas shorter measurement time conditions increase the detection limit for the Fe concentration. Accordingly, a shorter measurement time and a lowered detection limit for the Fe concentration were not achieved at the same time in Standard Mode.

Next, the inventors then variously changed the measurement parameters in Ultimate Mode and discovered the following. First, also in Ultimate Mode, there was a basic trend that the detection limit for the Fe concentration was lower under longer measuring time conditions, whereas the detection limit for the Fe concentration was higher under shorter measuring time conditions. However, what was discovered was that since Ultimate Mode allows the time required for measurement to be easily shortened, when the measurement parameters met certain conditions in Ultimate Mode, the detection limit for the Fe concentration could be made lower than in the case of setting the measurement parameters to the above-mentioned known values (conditions recommended by the SPV apparatus manufacturer) in Standard Mode and the time required for measurement could be shortened.

In Ultimate Mode, unlike in the case of Standard Mode, parameters Time Between Readings and Time Constant to be described were found to have a great influence on the detection limit for the Fe concentration. Based on these findings, the inventors discovered specific conditions under which both the detection limit for the Fe concentration and the time required for the measurement can be reduced. This led to this disclosure.

We provide:

(1) A method of measuring an Fe concentration in a p-type silicon wafer, comprising measuring an Fe concentration in a silicon wafer based on measurement using an SPV method, wherein the measurement is performed in a measurement mode in which irradiation with a plurality of lights having mutually different wavelengths is performed during the same period under conditions where (i) Time Between Readings is 35 ms or more and 120 ms or less and Time Constant is 20 ms or more, or Time Between Readings is 10 ms or more and less than 35 ms and Time Constant is 100 ms or more, and (ii) Number of Readings is 12 times or less.

Advantageous Effect

According to the method of measuring the Fe concentration in a p-type silicon wafer by the SPV method, the detection limit of a measurement for the Fe concentration can be lowered, and the measurement can be performed in a short time.

DETAILED DESCRIPTION

One embodiment of this disclosure relates to a method of measuring the Fe concentration in a p-type silicon wafer based on the measurement of the Fe concentration in a silicon wafer using an SPV method (SPV measurement).

First, how to determine the Fe concentration at certain portions on the surface of the p-type silicon wafer will be described. Fe present in the p-type silicon wafer in a normal state combines with a dopant (for example, boron) by electrostatic force to form Fe—B pairs. On the other hand, when the wafer is irradiated with intense light, Fe becomes dissociated from B. The diffusion length of minority carriers, determined by SPV measurement means a distance over which the minority carriers generated by the light used for irradiation in the SPV measurement can move. The minority carriers disappear for example by being trapped by a trap state formed by Fe in the wafer. Trap states formed by Fe in the p-type silicon wafer include Fe—B (iron-boron pairs) which is ordinary present and Fei (interstitial iron) formed by the light irradiation. The trap states formed by Fe in different forms have different minority carrier trapping abilities. Specifically, Fe can more easily trap minority carriers and the diffusion length is shorter in the dissociated state than in the normal state. Using the difference, the Fe concentration in the wafer can be found as follows.

First, SPV measurement is performed in a normal state and the diffusion length $L_{FeB}$ of minority carriers is determined. Next, SPV measurement is performed in a dissociated state and the diffusion length $L_{Fei}$ of minority carriers is determined. The Fe concentration [Fe] can be calculated by the following formula.

$$[Fe]=C\times(1/L_{Fei}-1/L_{FeB}),$$

where C is a constant.

Thus, a map of the Fe concentration in the wafer can be obtained by performing SPV measurements in a normal state and in a dissociated state on a plurality of portions on the wafer surface. The process for dissociating Fe—B pairs is by a usual method, for example, but not limited to irradiation using a flash lamp.

Figure 1:
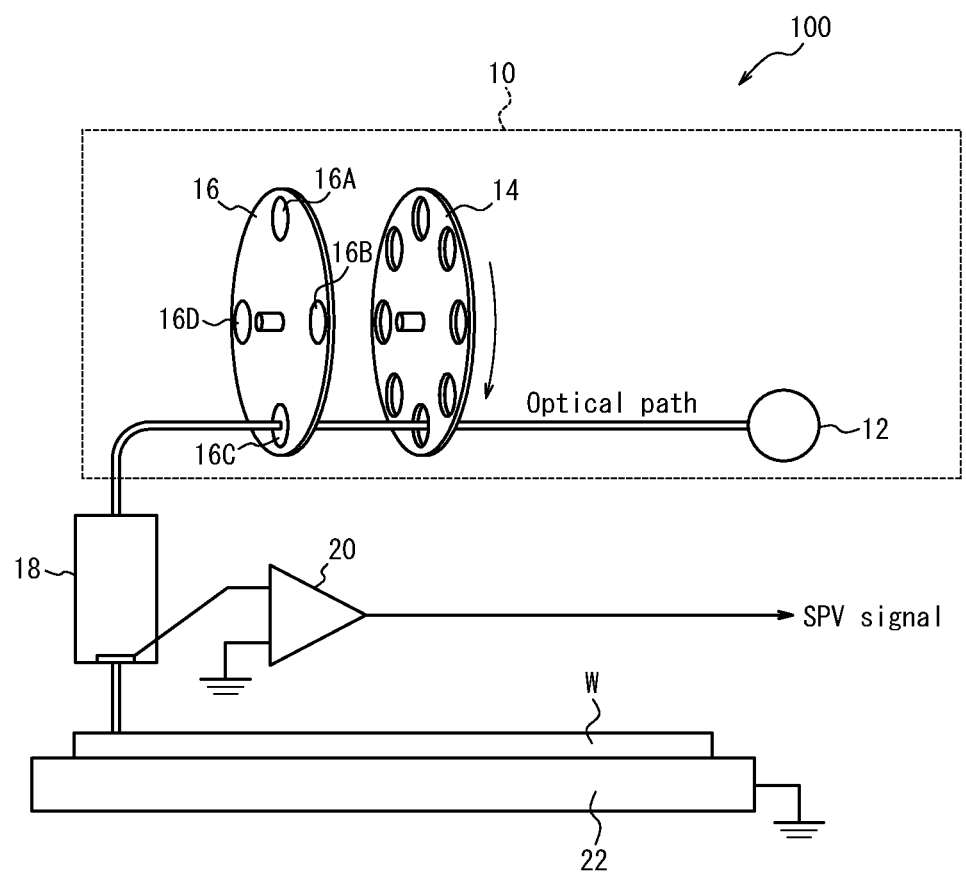
FIG. 1 is a schematic view illustrating the structure of an SPV measurement apparatus which can be used for a method of measuring the Fe concentration in a p-type silicon wafer, according to one embodiment of this disclosure.

Next, the structure of an SPV measurement apparatus used for SPV measurement will be described. FIG. 1 is a schematic view illustrating an example of the structure of an analog SPV measurement apparatus 100. The SPV measurement apparatus 100 has an optical module 10, a probe 18, a lock-in amplifier 20, and a stage 22. The optical module 10 has a light source 12, a chopper 14, and a filter wheel 16.

The light source 12 is composed of for example white LEDs, and an optical path is designed so that light emitted from the light source is directed to the surface of a wafer W placed on the stage 22. The chopper 14 is a circular member having a plurality of openings in a circular pattern. The rotation of the chopper allows light emitted from the light source 12 to have a frequency. In other words, the surface of the wafer W is irradiated with the light intermittently. The frequency of light obtained here is defined as a "chopping frequency (CF)", which is one of the measurement parameters. The CF is typically set to around 500 Hz to 3000 Hz.

The filter wheel 16 has the openings 16A to 16D provided with filters that transmit only lights having mutually different wavelengths. This allows the surface of the wafer W to be irradiated with lights having certain wavelengths.

Here, FIG. 1 illustrates a case where the optical module 10 is an analog module; alternatively, it may be a digital module. In the case where the optical module 10 is a digital module, a plurality of single color LEDs having mutually different emission wavelengths are modularized, and the surface of the wafer W can be irradiated with lights having certain wavelengths with certain frequencies by making the LEDs flash.

The wavelengths of the irradiation lights may be any different wavelengths between 780 nm to 1004 nm. However, when SPV measurements are performed using lights having two wavelengths, a combination of 780 nm and 1004 nm can be given as an example of the wavelengths, and when SPV measurements are performed using lights having four wavelengths, a combination of 780 nm, 914 nm, 975 nm, and 1004 nm can be given as an example.

The intensity (amount) of irradiation light is set as Injection Level, which is one of the measurement parameters. Typically, the amount of light of Level 2 is $2\times10^{12}$ (atoms/cc), and that of Level 3 is $3\times10^{12}$ (atoms/cc), and one of these two parameters is used.

The probe 18 has a capacitive sensor on its end, thereby continuously measuring the capacitance formed between the surface of the wafer W and the probe 18. Prior to SPV measurement, the surface of the wafer W is subjected to a HF treatment and the surface is positively charged. When the wafer W is irradiated with light from the light source 12, minority carriers (electrons for a p-type wafer) are generated in the wafer and migrate toward the positively charged surface. Upon reaching the surface, the electrons are annihilated by the positive charges on the surface, so that the electric potential of the surface decreases, resulting in reduced capacitance. The drop in the capacitance is detected as an SPV signal. When more electrons are trapped by Fe in the wafer, the surface potential is less likely to be reduced.

The lock-in amplifier 20 amplifies and detects an SPV signal corresponding to the capacitance measured with the probe 18. Thus, an SPV signal can be obtained. Moving the stage 22 allows SPV measurements to be performed on a plurality of portions on the surface of the wafer W.

The SPV apparatus may be a known SPV apparatus, such as for example FAaST 330 manufactured by Semilab-SDi LLC or SPV Station 1020 manufactured by Strategic Diagnostics Inc.

Next, a method of SPV measurement and how to determine the diffusion length will be described. First, SPV measurement is performed using light having a first wavelength (for example, 780 nm) to obtain an SPV signal corresponding to the light. In a graph, the "penetration length" dependent on the wavelength of the irradiation light is represented by the X-axis, and the "amount of light/SPV signal" is represented by the Y-axis. The measurement results are plotted in the graph. Subsequently, SPV measurement is performed using light having a second wavelength (for example, 1004 nm) different from the first wavelength to obtain an SPV signal corresponding to the light. Similarly, the measurement results are plotted in the graph. The X intercept of the straight line joining the thus obtained two plots can be determined as a "diffusion length". Note that when SPV measurements are performed using three or more wavelengths, since three or more plots are obtained, the X intercept is calculated by approximation such as the method of least squares.

Here, the measurement modes include two modes of Standard Mode and Ultimate Mode. In Standard Mode, an SPV measurement is performed using a certain wavelength and sequentially other SPV measurements are performed using wavelengths that are different from the preceding wavelength and from each other, so that the plots are obtained sequentially. On the other hand, in Ultimate Mode, irradiation with a plurality of lights having mutually different wavelengths is performed at a time in one SPV measurement, so that the plots are obtained by the one measurement. In this case, chopping frequencies of the wavelengths are made different from each other, thereby obtaining SPV signals having different frequencies in the lock-in amplifier 20: thus, SPV signals corresponding to the respective wavelengths can be obtained separately.

Here, the measurement parameters focused on in one embodiment of this disclosure will be described. Number of Readings (hereinafter referred to as "NR") means the number of SPV signals acquired in one SPV measurement. Time Constant (hereinafter referred to as "TC") means the acquisition time during which each SPV signal is acquired. Time Between Readings (hereinafter referred to as "TB") means the time interval (waiting period) between the time points at which the signals are obtained.

Specific meanings of the parameters will be described with reference to known conditions recommended for FAaST 330 (digital) manufactured by Semilab-SDi LLC (Standard Mode, CF: 1600±100 Hz, amount of light: Level 3, NR: 12 times, TC: 20 ms, and TB: 20 ms) for example. In this case, irradiation is performed with light having the first wavelength (for example, 780 nm) made to have a CF of 1600±100 Hz for a predetermined time recommended by the manufacturer, and SPV signals are then acquired for 20 ms, followed by a waiting period of 20 ms. This procedure is repeated 12 times to obtain 12 SPV signals. The mean value of these 12 SPV signals is used as an SPV signal corresponding to the light having the first wavelength. After that, irradiation is performed with light having the second wavelength (for example, 1004 nm) made to have a CF of 1600±100 Hz for the predetermined time mentioned above, and SPV signals are then acquired for 20 ms, followed by a waiting period of 20 ms. This procedure is repeated 12 times to obtain 12 SPV signals. The mean value of these 12 SPV signals is used as an SPV signal corresponding to the light having the second wavelength.

Next, in Ultimate Mode, under the conditions of CF: 1600±100 Hz, amount of light: Level 3, NR: 12 times. TC: 20 ms, and TB: 20 ms, a measurement is performed as follows. In this case, irradiation is performed with light having the first wavelength (for example, 780 nm) made to have a frequency within a range of CF1: 1600±100 Hz and light having the second wavelength (for example, 1004 nm) made to have a frequency of CF2 which is 50 Hz higher than CF1 at the same time for a predetermined time recommended by the manufacturer, and SPV signals are then acquired for 20 ms, followed by a waiting period of 20 ms. This procedure is repeated 12 times to obtain 12 SPV signals. From each SPV signal, a first SPV signal corresponding to the light having the first wavelength and a second SPV signal corresponding to the light having the second wavelength can be obtained separately; accordingly, the mean value of the first SPV signals and the mean value of the second SPV signals are used as SPV signals corresponding to the lights having the respective wavelengths.

Here, as demonstrated in Experimental Example 1 described below, under the above recommended conditions in Standard Mode, the detection limit for the Fe concentration was $1.0 \times 10^9/cm^3$, and the time taken for the measurement on one wafer was 28 min. Changing NR, TC, and TB to any values in Standard Mode failed to result in a detection limit for the Fe concentration of less than $1.0 \times 10^9/cm^3$ and a time taken for the measurement on one wafer of less than 28 min.

Here, as demonstrated in Experimental Example 2, in Ultimate Mode, measurement parameters meeting certain conditions described below resulted in a detection limit for the Fe concentration of less than $1.0 \times 10^9/cm^3$ and a time taken for the measurement on one wafer of less than 28 min. Accordingly, in one embodiment of this disclosure, it is important to perform SPV measurement under the following conditions in Ultimate Mode.

First, TB is set to 35 ms or more and 120 ms or less and TC is set to 20 ms or more (first set of conditions), or alternatively. TB is set to 10 ms or more and less than 35 ms and TC is set to 100 ms or more (second set of conditions). Under the above recommended conditions in Standard Mode, the sum of TB and TC is 40 ms, whereas in one embodiment of this disclosure, the sum of TB and TC is at least 55 ms. Thus, when TB and/or TC are longer than in conventional techniques, the detection limit for the Fe concentration can be lowered. The inventors concluded that such a result might have been caused as follows. In the case of Ultimate Mode, the total amount of light applied to the wafer at a time is twice the amount in the case of Standard Mode, so that the wafer W easily gets hot due to the light irradiation. However, when the sum of TB and TC (that is, the length of time during which light irradiation is not performed) is longer than in conventional techniques, a rise in the temperature of the wafer W at the time of reading the SPV signal can be suppressed. This can conceivably lower the detection limit for the Fe concentration.

With respect to the first set of conditions, even when TB is 35 ms or more and 120 ms or less, the detection limit for the Fe concentration cannot be lowered when TC is less than 20 ms. Further, even when TC is 20 ms or more and less than 100 ms, the detection limit for the Fe concentration cannot be lowered when TB is less than 35 ms. TB exceeding 120 ms not only increases the time required for a measurement on one wafer but also promotes recombination of Fe—B pairs, so that the detection limit for the Fe concentration would become higher. Therefore, the first set of conditions is necessarily satisfied.

With respect to the second set of conditions, when TB is 10 ms or more and less than 35 ms, the detection limit for the Fe concentration cannot be lowered when TC is less than 100 ms. Further, even when TC is 100 ms or more, the detection limit for the Fe concentration cannot be lowered when TB is less than 10 ms. When the second set of conditions is applied, the upper limit of TC is preferably 1000 ms. TC exceeding 1000 ms not only increases the time required for a measurement on one wafer but also promotes recombination of Fe—B pairs, so that the detection limit for the Fe concentration would become higher.

Secondly, NR is set to be 12 times or less. NR exceeding 12 times increases the time required for a measurement on one wafer. It should be noted that under the above first and second sets of conditions, sufficient detection sensitivity for the Fe concentration was achieved when NR was even one time.

EXAMPLES

Experimental Example 1: Standard Mode

SPV measurement was performed using FAaST 330 manufactured by Semilab-SDi LLC as an SPV apparatus in Standard Mode with CF being set to 1584 Hz and the amount of light being fixed to Level 3, and with NR, TC, and TB being set to the values presented in Table 1. The irradiation wavelengths were set to 780 nm and 1004 nm.

The detection limit for the Fe concentration was determined by the following technique. As a blank wafer, a boron-doped p-type silicon wafer in which Fe—B pairs were dissociated was prepared based on the description of JP 2011-054784 A, and nine points on the surface of this wafer were subjected to a HF treatment, followed by SPV measurement. The diffusion length of minority carriers obtained by the measurements was treated as the diffusion length $L_{FeB}$ of minority carriers in a normal state. Subsequently, the silicon wafer was irradiated with light from a flash lamp 12 times at intervals of 5 s, and then waited for 5 min. After that, SPV measurement was performed again on the nine points on the surface, and the diffusion length $L_{Fei}$ of minority carriers in a dissociated state was determined. This measurement was repeated 10 times without interruption. Thereupon, 10 Fe concentrations [Fe] were calculated from the 10 respective diffusion lengths $L_{FeB}$ and $L_{Fei}$ obtained for each point based on the aforementioned formula. Further, the average X and the standard deviation σ of [Fe] including negative values were calculated for each point. |X+3σ| was calculated for each point, and the maximum |X+3σ| value was determined as "the detection limit for the Fe concentration", and the results are presented in Table 1. Note that the "Detection limit evaluation" field in Table 1 is based on the following criteria.

++: 15% or more lower than in Conventional Example
+: less than 15% lower than in Conventional Example
−: less than 15% higher than in Conventional Example
−−: 15% or more higher than in Conventional Example The process time was determined by the following technique. The diffusion lengths $L_{FeB}$ and $L_{Fei}$ were determined for 177 points on the surface of a boron-doped p-type silicon wafer by a technique similar to the technique in the preceding paragraph, and the Fe concentrations [Fe] for the 177 points on the surface were calculated based on the aforementioned formula, thereby obtaining an Fe concentration map. The time taken from loading the wafer to unloading the wafer is defined as "process time", and the results are presented in Table 1. Note that the "Process time evaluation" field in Table 1 is based on the following criteria.

++: 15% or more shorter than in Conventional Example
+: less than 15% shorter than in Conventional Example
−: less than 15% longer than in Conventional Example
−−: 15% or more longer than in Conventional Example

TABLE 1

| No. | TC (ms) | TB (ms) | NR (number of times) | Mode | Process time (min) | Process time evaluation | Fe concentration detection limit (/cm³) | Detection limit evaluation | Classification |
|---|---|---|---|---|---|---|---|---|---|
| 1-1 | 20 | 20 | 12 | Standard | 28 | N/A | 1.00E+09 | N/A | Conventional Example |
| 1-2 | 20 | 10 | 6 | Standard | 25 | + | 1.40E+09 | −− | Comparative Example |
| 1-3 | 10 | 50 | 12 | Standard | 31 | − | 1.02E+09 | − | Comparative Example |
| 1-4 | 50 | 100 | 24 | Standard | 58 | −− | 4.14E+08 | ++ | Comparative Example |
| 1-5 | 10 | 10 | 24 | Standard | 26 | + | 1.15E+09 | −− | Comparative Example |
| 1-6 | 50 | 50 | 6 | Standard | 32 | − | 7.59E+08 | ++ | Comparative Example |
| 1-7 | 50 | 10 | 24 | Standard | 31 | − | 8.62E+08 | + | Comparative Example |
| 1-8 | 50 | 20 | 24 | Standard | 34 | −− | 6.43E+08 | ++ | Comparative Example |
| 1-9 | 50 | 30 | 24 | Standard | 37 | −− | 5.82E+08 | ++ | Comparative Example |
| 1-10 | 50 | 40 | 24 | Standard | 41 | −− | 4.83E+08 | ++ | Comparative Example |
| 1-11 | 100 | 100 | 1 | Standard | 36 | −− | 1.09E+09 | − | Comparative Example |

Figure 2:
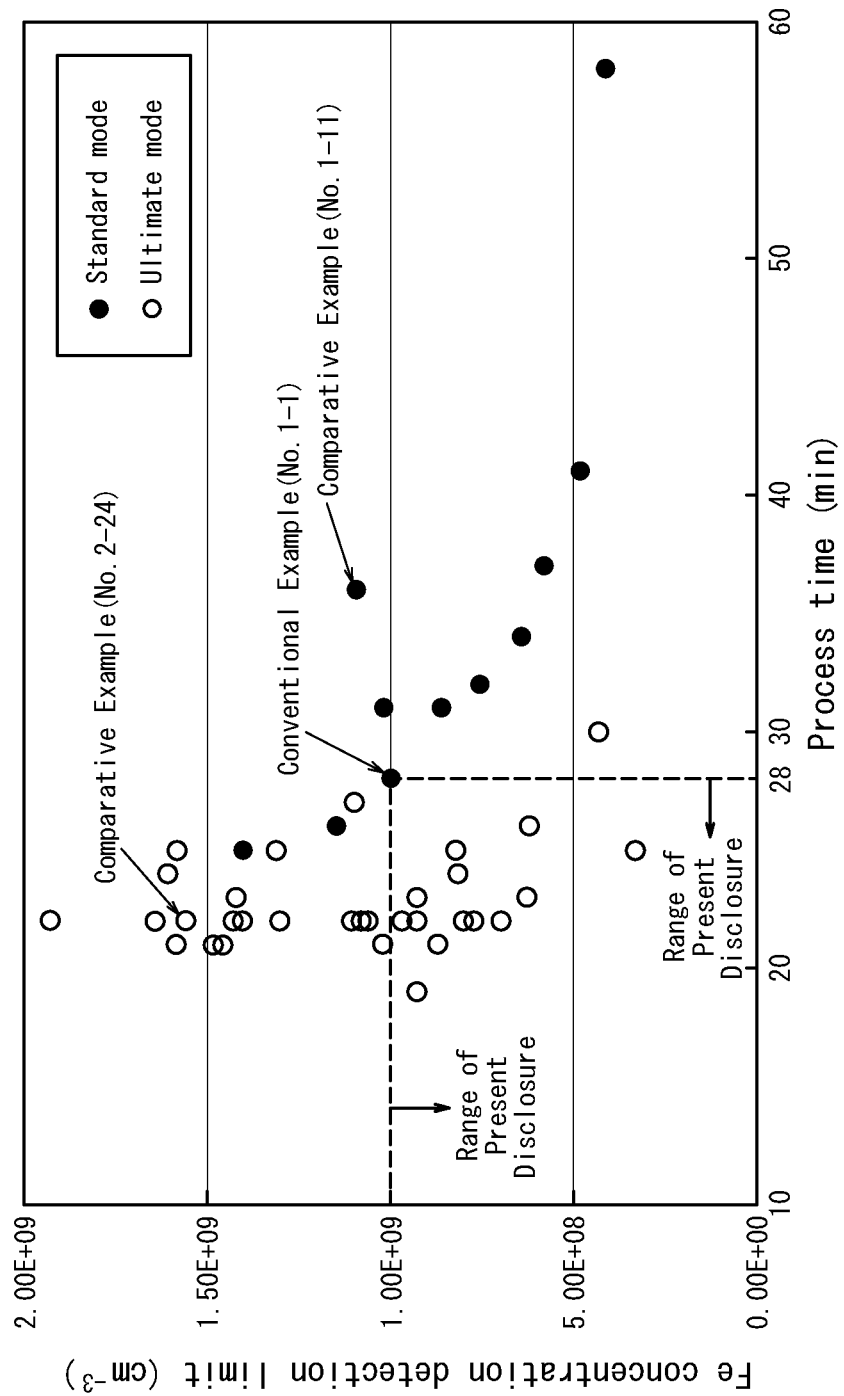
FIG. 2 is a graph illustrating the relationship between the detection limit for the Fe concentration and the process time.

As given in Table 1 and FIG. 2, under recommended conditions in Standard Mode (Conventional Example. No. 1-1), the detection limit for the Fe concentration was 1.0× 10⁹/cm³, and the process time was 28 min. Further, it was found that increasing NR had lowered the detection limit for the Fe concentration. However, increasing NR would increase the process time. The relationship between the detection limit for the Fe concentration and the process time was found from the measurement results in Table 1 and is given in FIG. 2. Thus, a favorable detection limit for the Fe concentration and a favorable process time cannot be achieved at the same time. Changing NR, TC, and TB to any values failed to result in an Fe concentration for the detection limit of less than $1.0 \times 10^9/cm^3$ and a process time of less than 28 min. Further, for example, even when TC and TB were increased as in Comparative Examples Nos. 1-11, the detection limit could not be lowered.

Experimental Example 2: Ultimate Mode

SPV measurement was performed using FAaST 330 manufactured by Semilab-SDi LLC as an SPV apparatus in Ultimate Mode with CF1 being set to 1584 Hz, CF2 being set to 1634 Hz, and the amount of light being fixed to Level 3, and with NR, TC, and TB being set to the values presented in Table 2. The irradiation wavelengths were set to 780 nm and 1004 nm. The detection limit for the Fe concentration and the process time were determined by a technique similar to the technique in Experimental Example 1, and the results are presented in Table 2. The evaluation results are presented in Table 2 based on similar criteria. The relationship between the detection limit for the Fe concentration and the process time was found from the measurement results in Table 2 and is also given in FIG. 2.

conditions), and NR was set to 12 times or less in Ultimate Mode; an Fe concentration for the detection limit of less than $1.0 \times 10^9/cm^3$ and a process time of less than 28 min were achieved.

INDUSTRIAL APPLICABILITY

According to a method of measuring the Fe concentration in a p-type silicon wafer by the SPV method of this disclosure, the detection limit of a measurement for the Fe concentration can be lowered, and the measurement can be performed in a short time.

REFERENCE SIGNS LIST

100: SPV measurement apparatus
10: Optical module
12: Light source
14: Chopper
16: Filter wheel
18: Probe
20: Lock-in amplifier
22: Stage
W: Silicon wafer

TABLE 2

| No. | TC (ms) | TB (ms) | NR (number of times) | Mode | Process time (min) | Process time evaluation | Fe concentration detection limit (/cm$^3$) | Detection limit evaluation | Classification |
|---|---|---|---|---|---|---|---|---|---|
| 1-1 | 20 | 20 | 12 | Standard | 28 | N/A | 1.00E+09 | N/A | Conventional Example |
| 2-1 | 20 | 50 | 24 | Ultimate | 30 | − | 4.34E+08 | ++ | Comparative Example |
| 2-2 | 10 | 100 | 6 | Ultimate | 25 | + | 1.58E+09 | −− | Comparative Example |
| 2-3 | 50 | 10 | 24 | Ultimate | 24 | + | 1.61E+09 | −− | Comparative Example |
| 2-4 | 50 | 20 | 24 | Ultimate | 25 | + | 1.31E+09 | −− | Comparative Example |
| 2-5 | 50 | 30 | 24 | Ultimate | 27 | + | 1.10E+09 | − | Comparative Example |
| 2-6 | 10 | 10 | 1 | Ultimate | 21 | ++ | 4.55E+09 | −− | Comparative Example |
| 2-7 | 10 | 10 | 6 | Ultimate | 22 | ++ | 4.08E+09 | −− | Comparative Example |
| 2-8 | 50 | 10 | 1 | Ultimate | 21 | ++ | 1.02E+09 | − | Comparative Example |
| 2-9 | 20 | 10 | 6 | Ultimate | 22 | ++ | 3.47E+09 | −− | Comparative Example |
| 2-10 | 10 | 10 | 12 | Ultimate | 22 | ++ | 1.64E+09 | −− | Comparative Example |
| 2-11 | 50 | 20 | 6 | Ultimate | 22 | ++ | 1.08E+09 | − | Comparative Example |
| 2-12 | 20 | 10 | 12 | Ultimate | 21 | ++ | 2.14E+09 | −− | Comparative Example |
| 2-13 | 100 | 10 | 1 | Ultimate | 21 | ++ | 8.75E+08 | + | Example |
| 2-14 | 50 | 10 | 12 | Ultimate | 22 | ++ | 1.30E+09 | −− | Comparative Example |
| 2-15 | 100 | 10 | 12 | Ultimate | 22 | ++ | 9.69E+08 | + | Example |
| 2-16 | 50 | 35 | 1 | Ultimate | 19 | ++ | 9.30E+08 | + | Example |
| 2-17 | 20 | 20 | 1 | Ultimate | 21 | ++ | 1.49E+09 | −− | Comparative Example |
| 2-18 | 50 | 40 | 1 | Ultimate | 22 | ++ | 7.00E+08 | ++ | Example |
| 2-19 | 100 | 100 | 1 | Ultimate | 22 | ++ | 8.04E+08 | ++ | Example |
| 2-20 | 50 | 35 | 6 | Ultimate | 23 | ++ | 6.31E+08 | ++ | Example |
| 2-21 | 20 | 20 | 6 | Ultimate | 22 | ++ | 1.40E+09 | −− | Comparative Example |
| 2-22 | 50 | 40 | 6 | Ultimate | 23 | ++ | 9.29E+08 | + | Example |
| 2-23 | 100 | 100 | 6 | Ultimate | 25 | + | 3.32E+08 | ++ | Example |
| 2-24 | 20 | 20 | 12 | Ultimate | 22 | ++ | 1.56E+09 | −− | Comparative Example |
| 2-25 | 100 | 25 | 1 | Ultimate | 22 | ++ | 9.30E+08 | + | Example |
| 2-26 | 50 | 25 | 1 | Ultimate | 21 | ++ | 1.58E+09 | −− | Comparative Example |
| 2-27 | 50 | 25 | 6 | Ultimate | 22 | ++ | 1.43E+09 | −− | Comparative Example |
| 2-28 | 20 | 25 | 1 | Ultimate | 22 | ++ | 1.11E+09 | − | Comparative Example |
| 2-29 | 20 | 25 | 6 | Ultimate | 22 | ++ | 1.06E+09 | − | Comparative Example |
| 2-30 | 50 | 30 | 1 | Ultimate | 22 | ++ | 1.93E+09 | −− | Comparative Example |
| 2-31 | 50 | 30 | 6 | Ultimate | 23 | ++ | 1.42E+09 | −− | Comparative Example |
| 2-32 | 20 | 30 | 1 | Ultimate | 21 | ++ | 1.46E+09 | −− | Comparative Example |
| 2-34 | 50 | 35 | 12 | Ultimate | 24 | + | 8.18E+08 | ++ | Example |
| 2-35 | 20 | 50 | 12 | Ultimate | 25 | + | 8.22E+08 | ++ | Example |
| 2-36 | 50 | 120 | 1 | Ultimate | 22 | ++ | 7.75E+08 | ++ | Example |
| 2-37 | 50 | 120 | 6 | Ultimate | 26 | + | 6.24E+08 | ++ | Example |

As is apparent from Table 2 and FIG. 2, when NR, TC, and TB in Ultimate Mode were the same as those in Conventional Example No. 1-1 (Comparative Examples, Nos. 2-24), a shorter process time was achieved, yet the detection limit for the Fe concentration became higher. However, when TB was set to 35 ms or more and 120 ms or less and TC was set to 20 ms or more (first set of conditions), or alternatively, TB was set to 10 ms or more and less than 35 ms and TC was set to 100 ms or more (second set of

The invention claimed is:

1. A method of measuring an iron concentration in a p-type silicon wafer, based on a measurement that uses a surface photovoltage method (SPV), the method of measuring comprising:

performing the measurement in a measurement mode in which the p-type silicon wafer is irradiated during a same period with a plurality of lights having mutually different wavelengths,
wherein the measurement is performed under the following conditions:
(i) a Time Between Readings is 35 ms or more and 120 ms or less and a Time Constant is 20 ms or more, or the Time Between Readings is 10 ms or more and less than 35 ms and the Time Constant is 100 ms or more, and
(ii) a Number of Readings is 12 times or less,
the Number of Readings being defined by a number of SPV signals acquired during one SPV measurement,
the Time Constant being defined by a time period in which each of the number of SPV signals is acquired, and
the Time Between Readings being defined by a time interval between points in time at which successive signals among the number of SPV signals are acquired.

* * * * *

UNITED STATES PATENT AND TRADEMARK OFFICE
CERTIFICATE OF CORRECTION

PATENT NO. : 10,871,515 B2
APPLICATION NO. : 15/765792
DATED : December 22, 2020
INVENTOR(S) : S. Fukushima et al.

Page 1 of 1

It is certified that error appears in the above-identified patent and that said Letters Patent is hereby corrected as shown below:

In the Claims

At Column 10, Line 65 (Claim 1, Line 2), please change "wafer," to -- wafer --.

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*